US008327238B2

(12) United States Patent  
Gorobets

(10) Patent No.: US 8,327,238 B2  
(45) Date of Patent: Dec. 4, 2012

(54) ERASED SECTOR DETECTION MECHANISMS

(75) Inventor: Sergey Anatolievich Gorobets, Edinburgh (GB)

(73) Assignee: SanDisk Technologies Inc., Plano, TX (US)

( * ) Notice: Subject to any disclaimer, the term of this patent is extended or adjusted under 35 U.S.C. 154(b) by 1041 days.

(21) Appl. No.: 12/208,054

(22) Filed: Sep. 10, 2008

(65) Prior Publication Data

US 2009/0006929 A1 Jan. 1, 2009

Related U.S. Application Data

(62) Division of application No. 11/020,345, filed on Dec. 22, 2004, now Pat. No. 7,437,653.

(51) Int. Cl.  
*H03M 13/00* (2006.01)

(52) U.S. Cl. ........................................ 714/782; 714/784

(58) Field of Classification Search ................ 714/746, 714/782, 784, 785, 781, 718, 763  
See application file for complete search history.

(56) References Cited

U.S. PATENT DOCUMENTS

| | | | |
|---|---|---|---|
| 4,458,349 A | 7/1984 | Aichelmann et al. | |
| 4,604,751 A | 8/1986 | Aichelmann, Jr. | |
| 4,661,955 A | 4/1987 | Arlington et al. | |
| 4,677,606 A | 6/1987 | Ogata et al. | |
| 5,220,568 A * | 6/1993 | Howe et al. | 714/782 |
| 5,691,994 A * | 11/1997 | Acosta et al. | 714/784 |
| 6,021,463 A | 2/2000 | Belser et al. | |
| 6,373,750 B1 | 4/2002 | Kurosaki | |
| 6,646,921 B2 * | 11/2003 | Roohparvar | 365/185.22 |
| 6,662,334 B1 | 12/2003 | Stenfort | |
| 7,127,646 B1 | 10/2006 | Day | |
| RE40,252 E * | 4/2008 | Tanaka | 365/185.33 |
| 7,904,795 B2 * | 3/2011 | Liao et al. | 714/784 |
| 8,064,351 B2 * | 11/2011 | Reid et al. | 370/242 |
| 2004/0095666 A1 | 5/2004 | Asano et al. | |
| 2004/0153902 A1 * | 8/2004 | Machado et al. | 714/710 |
| 2004/0255225 A1 | 12/2004 | Takai | |

FOREIGN PATENT DOCUMENTS

| | | |
|---|---|---|
| JP | 2001-092723 | 4/2001 |
| JP | 2001-345714 | 12/2001 |
| JP | 2003-157697 | 5/2003 |
| JP | 2003-272391 | 9/2003 |
| JP | 2004-234545 | 8/2004 |

OTHER PUBLICATIONS

Office Action for Chinese Patent Application No. 200580047431.2 mailed Nov. 7, 2008, 4 pages.

(Continued)

*Primary Examiner* — Phung M Chung  
(74) *Attorney, Agent, or Firm* — Davis Wright Tremaine LLP

(57) ABSTRACT

The present invention presents a non-volatile memory and method for its operation that allows instant and accurate detection of erased sectors when the sectors contain a low number of zero bits, due to malfunctioning cells or other problems, and the sector can still be used as the number of corrupted bits is under the ECC correction limit. This method allows the storage system to become tolerant to erased sectors corruption, as such sectors can be used for further data storage if the system can correct this error later in the written data by ECC correction.

23 Claims, 8 Drawing Sheets

OTHER PUBLICATIONS

Notification of Transmittal of the International Search Report and the Written Opinion of the International Searching Authority, or the Declaration for SanDisk Corporation mailed May 22, 2005, 9 pages.
Communication Pursuant to Article 96(2) EPC, Application No. 05 857 177.9, mailed Jan. 2, 2008, 4 pages.
Communication Pursuant to Article 94(3) EPC for European Application No. EP 09 01 1945 dated Mar. 24, 2011, 6 pages.
Listing of Claims for European Application No. EP 09 01 1945 filed Dec. 15, 2005, 1 pages.
Notification of Reasons for Refusal for Japanese Application No. 2007-548468 dated Aug. 2, 2011, 9 pages.
European Search Report for Application. No. EP 09 01 1945 dated Jul. 21, 2010, 7 pages.
Extended European Search Report for Application No. EP 09 01 1945 dated Aug. 17, 2010, 7 pages.
Gist of the Office Action for Korean Application No. 2007-7015321 dated Feb. 21, 2012, 2 pages.
Notification of Reasons for Refusal for Japanese Patent Application No. 2007-548468 dated Jul. 24, 2012, 10 pages.

* cited by examiner

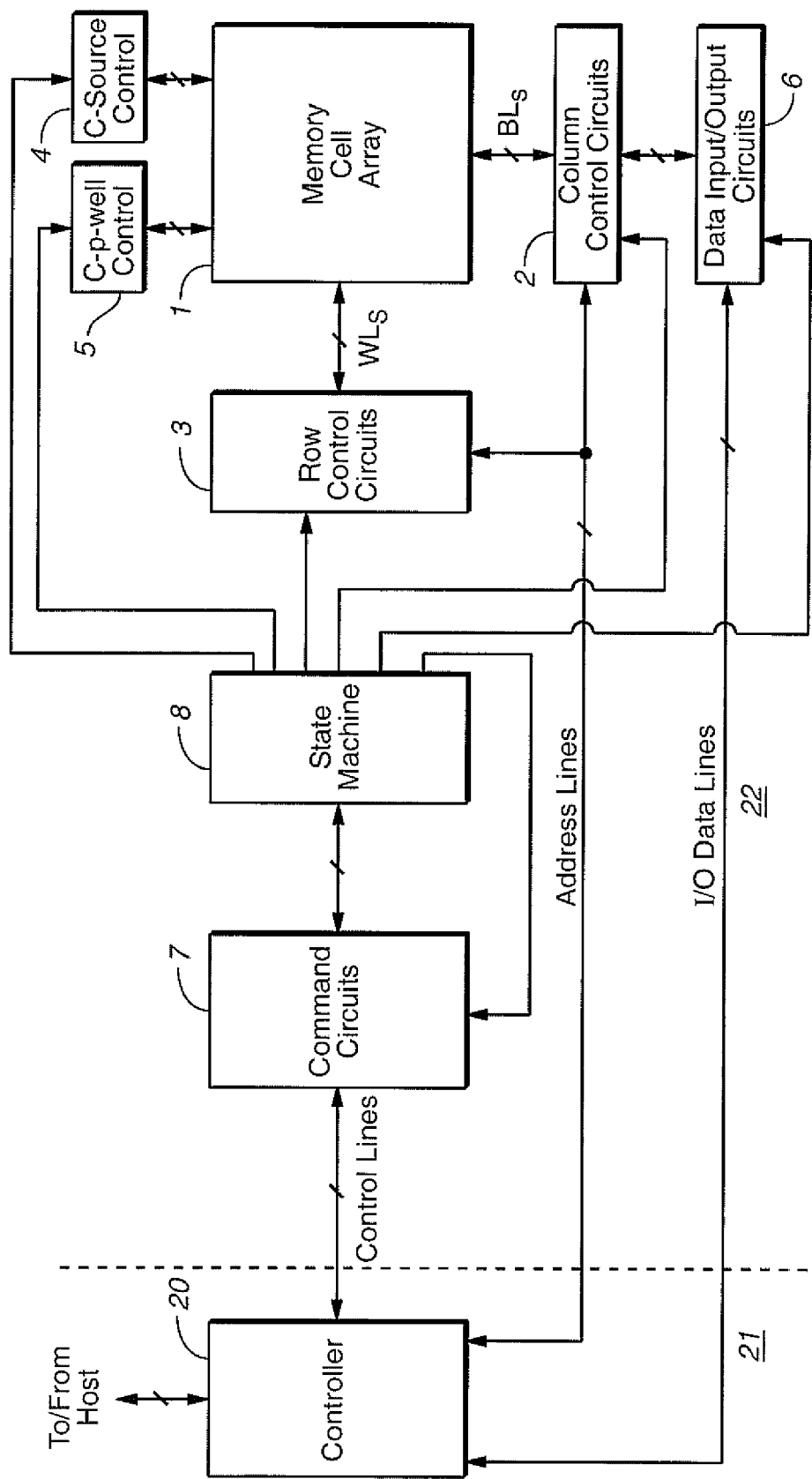
FIG._1

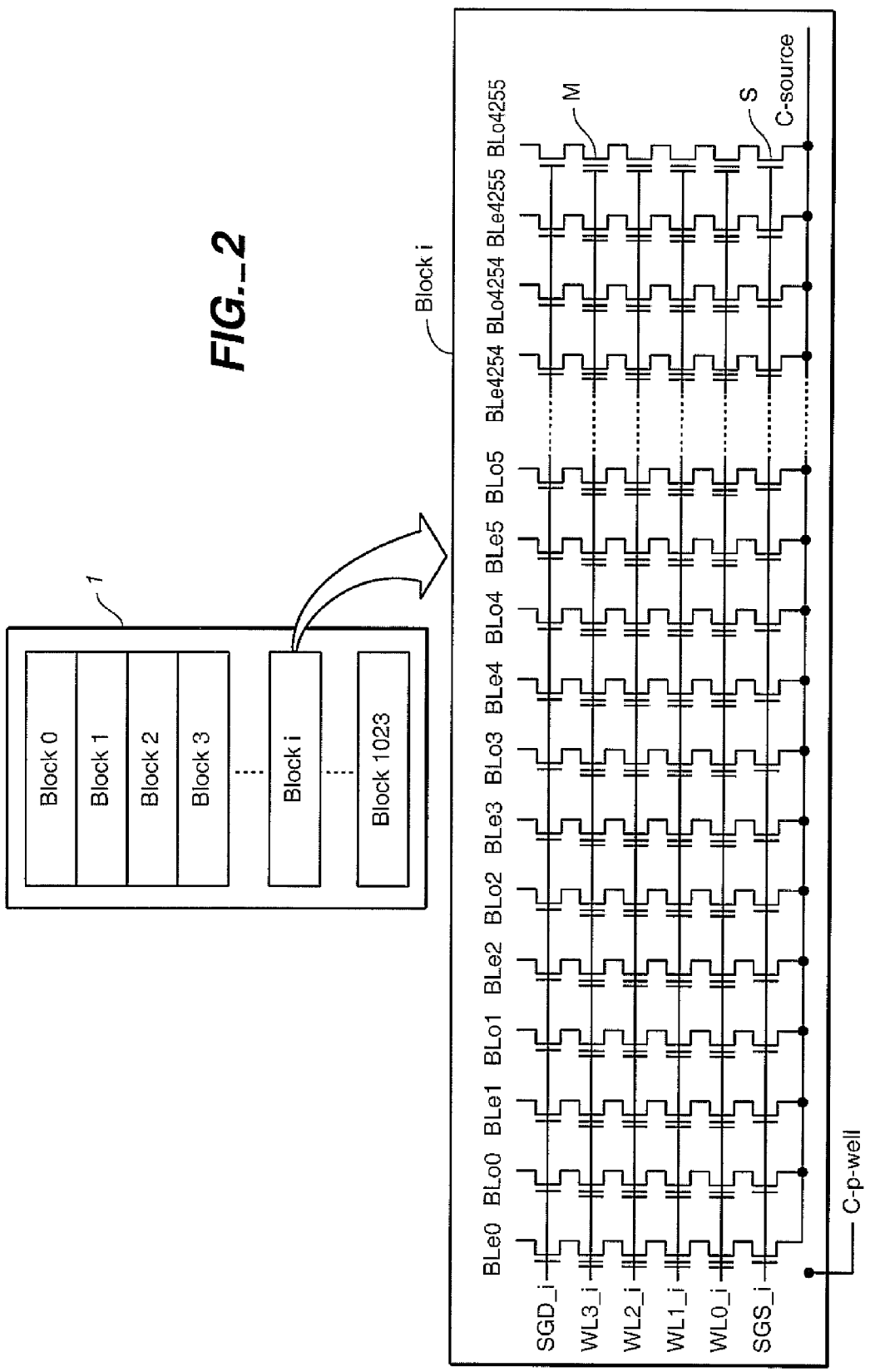

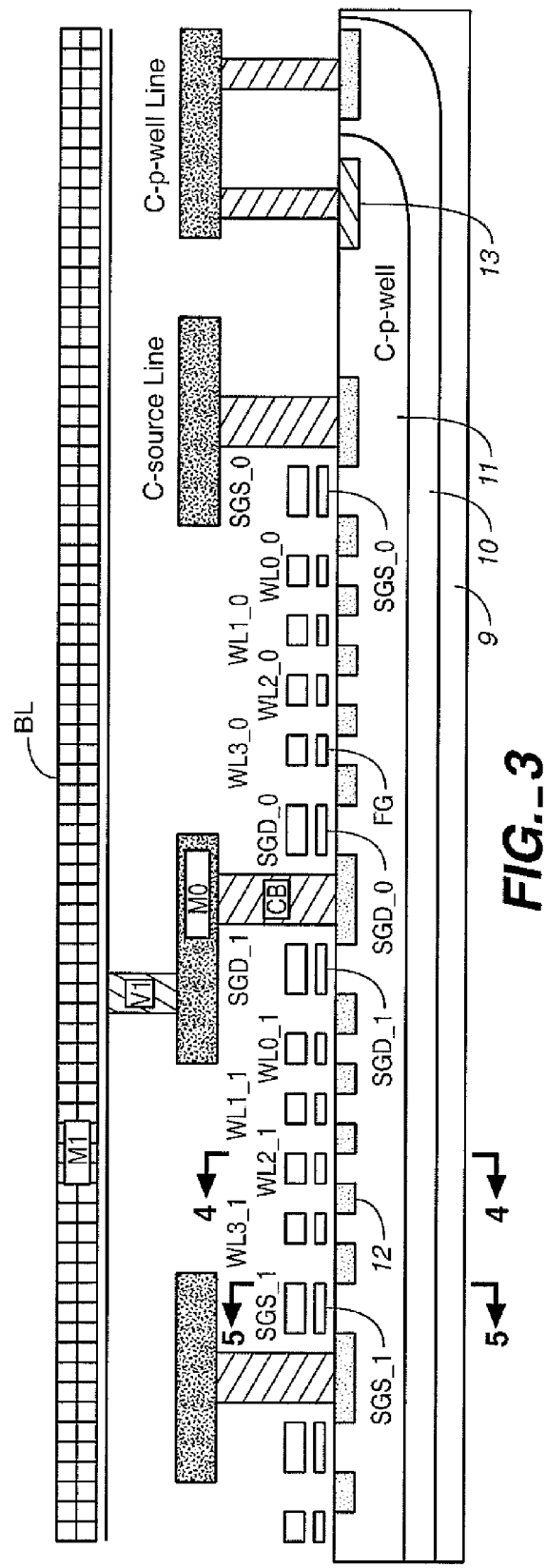
FIG._3

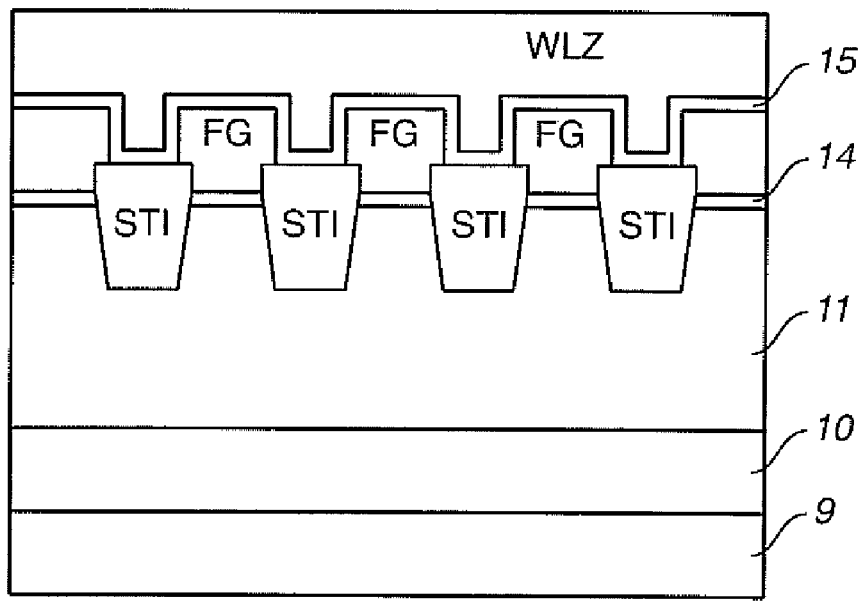
FIG._4
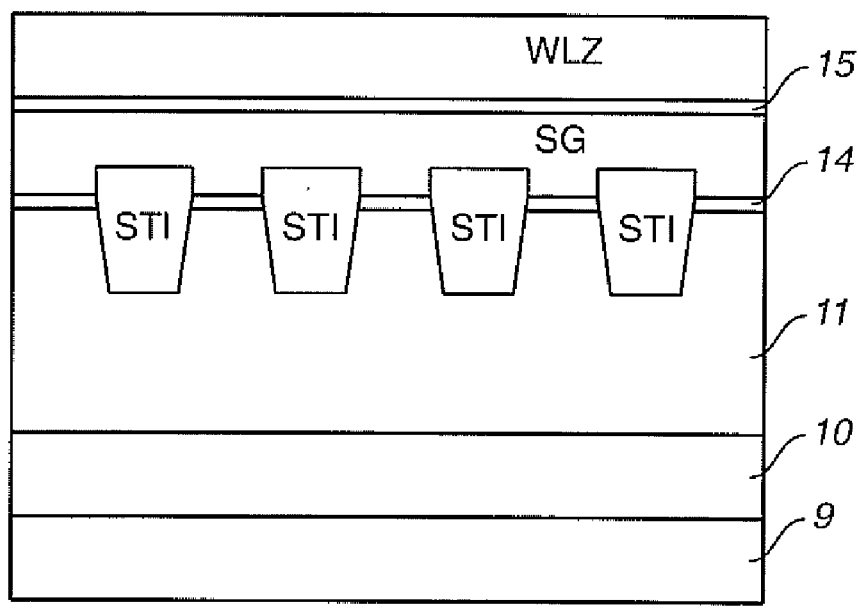
FIG._5

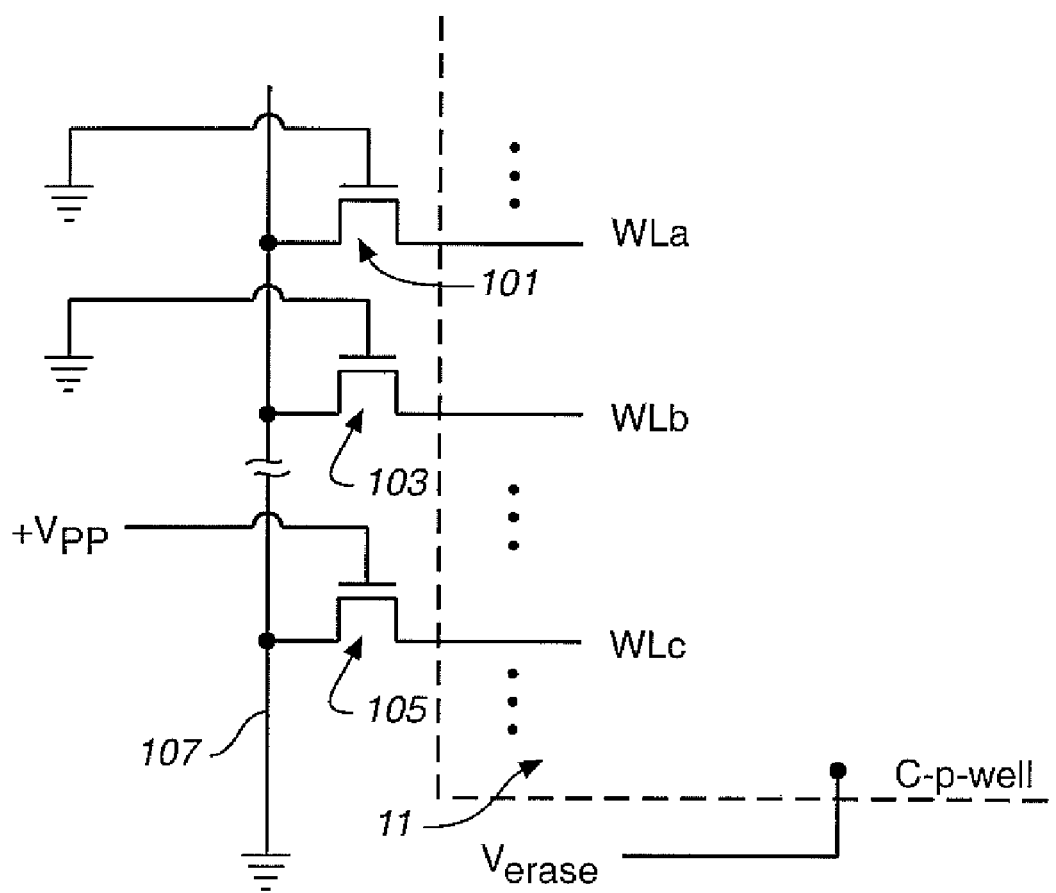
FIG._6

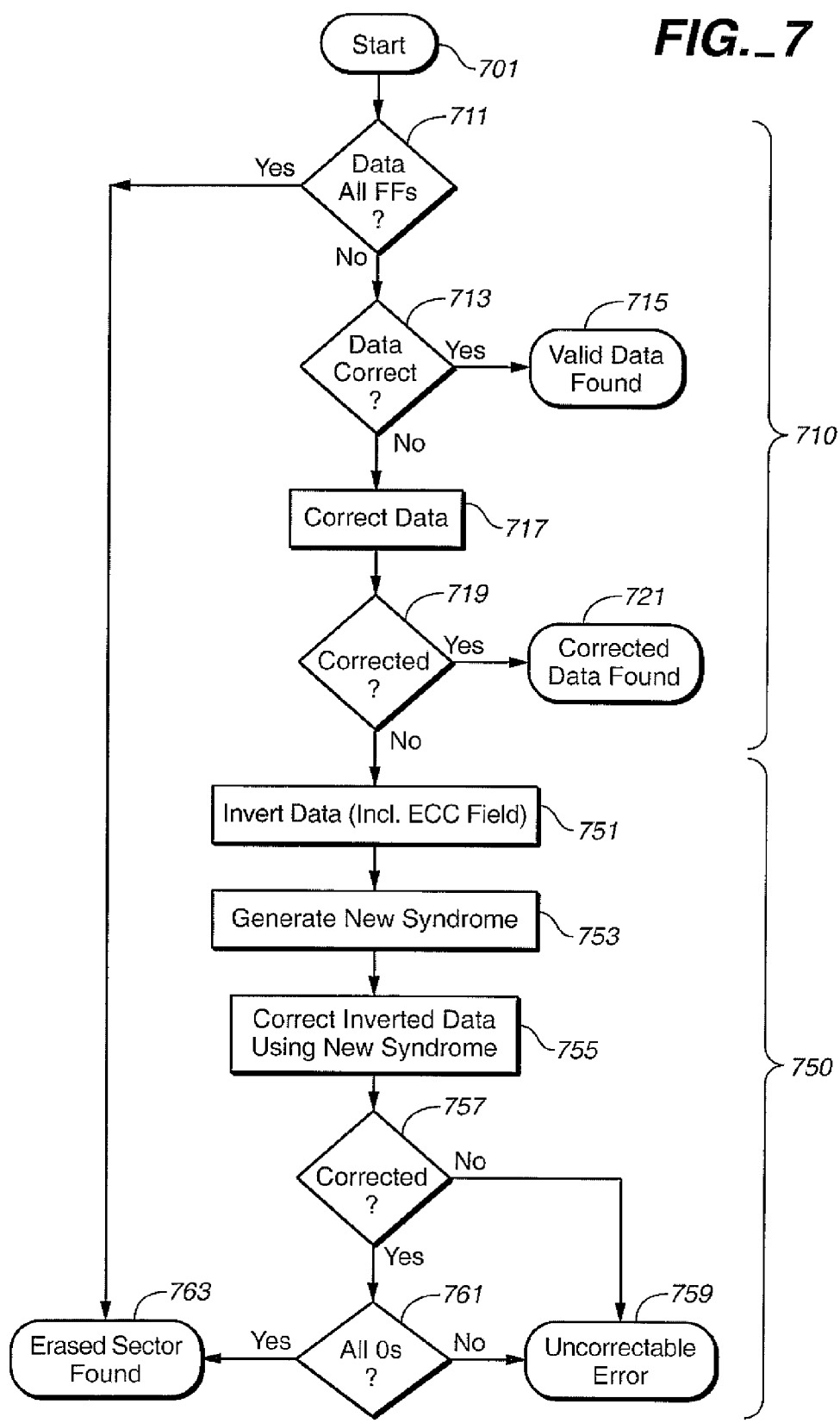
FIG. _7

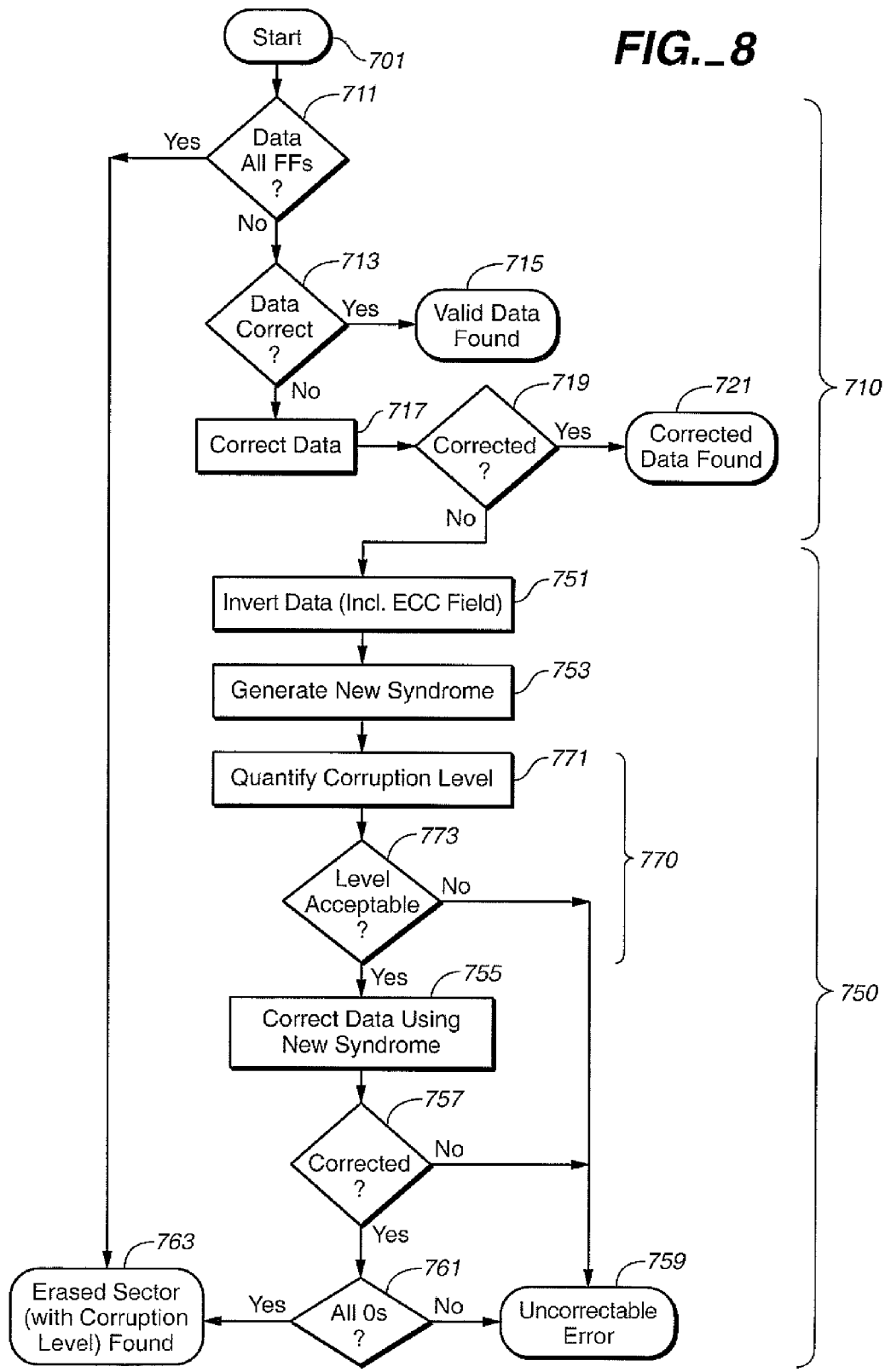
FIG._8

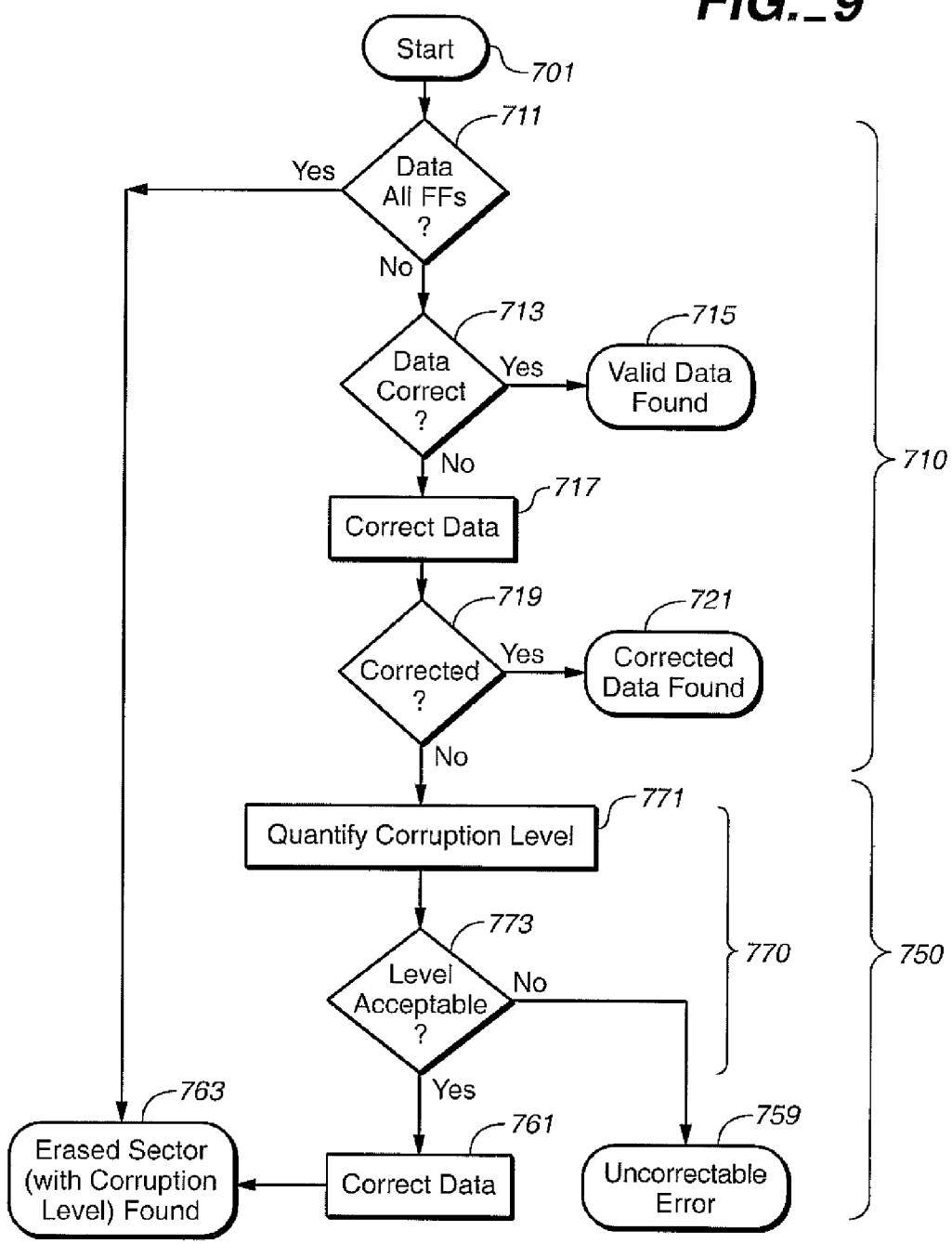
FIG._9

ERASED SECTOR DETECTION MECHANISMS

CROSS-REFERENCED APPLICATION

This application is a divisional of U.S. patent application Ser. No. 11/020,345, entitled "Erased Sector Detection Mechanisms," filed Dec. 22, 2004, now U.S. Pat. No. 7,437,653, which application is incorporated herein by this reference.

FIELD OF THE INVENTION

This invention relates generally to a non-volatile memory and its operation, and, more specifically, to techniques for determining whether portions of a rewritable memory has been erased along with its level of corruption.

BACKGROUND OF THE INVENTION

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable pages that are the basic unit for reading and programming user data. Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses received by the memory sub-system from a host, and physical addresses within the memory cell array. This translation often involves use of intermediate terms for a logical block number (LBN) and logical page. The controller also manages the low-level flash circuit operation through a series of commands that it issues to the flash memory devices via an interface bus. Another function the controller performs is to maintain the integrity of data stored to the subsystem through various means, such as by using an error correction code (ECC).

In flash and some other memory systems, before rewriting a page of data, it must be erased. Therefore, prior to selecting a page of data for storing data, an erased page needs to be found. Consequently, it is of importance to the system to be able to determine as rapidly and conveniently as possible which portions of the memory are in an erased state, either because they have yet to be used or they are a previously written sector that has undergone an erase process. This is not always a straightforward case of just keeping track of blocks in which the controller has instituted an erase operation. For example, in case of a power outage during operation of such a memory circuit, such as when a memory card is removed from a host or a power is lost to a device with an integrated memory, the memory may be caught in the middle of an erase operation, resulting in an incomplete operation. Additional, a sector have been erased, but contains a few corrupted bits, in which simply reading the sector will make it look as if it holds data.

A number of erased sector techniques are known. For example, the content of the sector can just be read; however, aside from the problem of possible corrupted bits, this does not distinguish between a sector that is actually erased and one that happens to have been written with what corresponds to the same data, namely all FFs. One prior art solution, found in U.S. Pat. No. 5,928,370, which is hereby incorporated by reference, is a solution where an ECC engine is used to detect 'ideal' erased sectors. The sector data is used to generate a new ECC field, which can be compared to a reference ECC field pre-generated for all FF's. If the ECC fields are the same the, sector is considered to be erased (containing all FF's). However, this still has the problem is that there is a probability of misdetection; additionally, this method does not allow detection of an erased sector with even a single zero bit.

SUMMARY OF THE INVENTION

According to a first aspect, the present invention presents a non-volatile memory and method for its operation that allows instant and accurate detection of erased sectors when the sectors contain a low number of zero bits, due to malfunctioning cells or other problems, and the sector can still be used as the number of corrupted bits is under the ECC correction limit. This method allows the storage system to become tolerant to erased sectors corruption, as such sectors can be used for further data storage if the system can correct this error later in the written data by ECC correction means.

A first set of embodiments inverts the page's contents (including the ECC field) so that an erased page (all FFs), with some corruption (0 bits), becomes a page with zero data, except for some high bits due to the corruption. The system can then interpret the erased page as valid data and apply the systems standard ECC methods to it. A new syndrome is generated and the page is corrected using this new syndrome. If the page is successfully corrected, it is checked to see whether it contains all 0s; if so, an erased sector has been found.

In a further aspects of the present invention, additional embodiments describe methods for detecting a partially erased sector (main data with overhead and ECC area), where such a page is not only detected but the level of corruption is quantified so that it is possible to decide whether the page is suitable for further use or not. When the sector data gets transferred to the controller, firmware or an ECC-customised circuit detects and counts zero bits (for BCH), or symbols (for Reed-Solomon) with at least one zero bit, in the sector, or in every codeword if the sector is divided to multiple adjacent or interleaved codewords. Thus, values of the counters then will contain a number of non-erased bits, or symbols, in the sector (or in every codeword of the sector). These values indicate the level of corruption of the erased sector.

In additional aspects of the present invention, for any of these embodiments, the erased sector detection process can be preceded by an preliminary check of whether the page is an uncorrupted erased state and a process of determining whether the page contains a limited number of zero bits.

Additional aspects, features and advantages of the present invention are included in the following description of exemplary embodiments, which description should be taken in conjunction with the accompanying drawings.

BRIEF DESCRIPTION OF THE DRAWINGS

FIG. 1 is a block diagram of a non-volatile memory system in which the various aspects of the present invention are described to be implemented;

FIG. 2 illustrates an existing circuit and organization of the memory array of FIG. 1 when a NAND type;

FIG. 3 shows a cross-sectional view, along a column, of a NAND type of memory array formed on a semiconductor substrate;

FIG. 4 is a cross-sectional view of the memory array of FIG. 3, taken at section 4-4 thereof;

FIG. 5 is a cross-sectional view of the memory array of FIG. 3, taken at section 5-5 thereof;

FIG. 6 illustrates such an arrangement for an erase mechanism;

FIG. 7 is a flow chart of a first embodiment of an erased page detection mechanism that allows for a level of corruption;

FIG. 8 is a flow chart of a second embodiment of an erased page detection mechanism that allows for the quantification of the level of corruption; and FIG. 9 is a flow chart of a third embodiment of an erased page detection mechanism that allows for the quantification of the level of corruption.

DESCRIPTION OF EXEMPLARY EMBODIMENTS

Example Non-Volatile Memory System

With reference to FIGS. 1-6, a specific non-volatile memory system is described in which the various aspects of the present invention are implemented, in order to provide specific examples. To reduce the amount of disturb in erase processes, the present invention maintains the control gates of non-selected storage elements at the same voltage level as their underlying well structure. In a exemplary embodiment, the storage elements are formed over a well structure. During an erase process, both the selected and non-selected storage elements over the well are raised to an erase voltage concurrently with establishing this voltage level in the well. This voltage is then held on the well and the non-selected storage elements, thereby reducing the chance of any erase related disturbs, while the selected storage elements are allowed to discharge, producing the needed erase conditions. Further, this can be accomplished without increasing any pitch area of circuit or adding new wires in the memory array, resulting in minimal additional peripheral area being added to the circuit.

For specificity, the present invention is described for an EEPROM flash memory of the NAND type, although generalizations will be discussed further below. In particular, the present exposition will use the sort of system described in U.S. Pat. No. 6,522,580 and the other applications related to NAND systems that are incorporated by reference above. When specific voltages are needed in the following, the erase voltage $V_{erase}$ is taken to be in the 15-20 volt range, the low logic level is taken as ground, and the high logic level $V_{dd}$ taken in the 1.5-3 volt range, although other values can be used, depending on design.

FIG. 1 is a block diagram of a flash memory system. Memory cell array 1 including a plurality of storage units M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply a program voltages combined with the bit line potential levels controlled by the column control circuit 2, and to apply an erase voltage coupled with a voltage of p-type regions (labeled as "c-p-well" 11 in FIG. 3) on which the memory cells (M) are formed. The c-source control circuit 4 controls the common source lines (labeled as "c-source" in FIG. 2) connected to the memory cells (M). The c-p-well control circuit 5 controls the voltage of the c-p-well.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20. Command data for controlling the flash memory device are input to a command interface connected to external control lines, which are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. The host initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

With reference to FIG. 2, an example structure of the memory cell array 1 is described. A flash EEPROM of a NAND type is described as an example. The memory cells (M) are partitioned into a number of blocks, 1,024 in a specific example. The data stored in each block are simultaneously erased. The block is thus the minimum unit of a number of cells that are simultaneously erasable. In each block, there are N columns, N=8,512 in this example, that are divided into left columns and right columns, as described in further U.S. Pat. No. 6,522,580. The bit lines are also divided into left bit lines (BLL) and right bit lines (BLR). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first (Drain) select gate line (SGD), and another terminal is connected to the c-source via a second (Source) select transistor (S) which gate electrode is coupled to a second select gate line (SGS). Although four floating gate transistors are shown to be included in each cell unit, for simplicity, other numbers of transistors, such as 8, 16, or even 32, are used. FIG. 2 also includes a connection, C-p-well, for supplying the well voltage.

In each block, in this example, 8,512 columns are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit. One terminal of the NAND cell unit is connected to corresponding bit line (BL) via a first select transistor (S) which gate electrode is coupled to a first select gate line (SGD), and another terminal is connected to the c-source via a second select transistor (S) which gate electrode is coupled to a second select gate line (SGS). Although, for simplicity, four floating gate transistors are shown to be included in each cell unit, a higher number of transistors, such as 8, 16 or even 32, are used.

In an alternate set of embodiments, as described in U.S. patent application Ser. No. 10/086,495, filed Feb. 27, 2002, which is hereby incorporated by reference, the array can be divided into left and right portions instead of the odd-even arrangement. The left and right sides may additionally have independent well structures with the right and left sides of the array each formed over such separate well structures, allowing the voltage levels to be set independently by the c-p-well control circuit 5 of FIG. 1. In a further variation, this could also allow erasure of a sub-block of less than all of the partitions of a block. Further variations that are compatible with the present invention are also described in application Ser. No. 10/086,495.

In the exemplary embodiments, the page size is 512 bytes, which is smaller than the cell numbers on the same word line. This page size is based on user preference and convention. Allowing the word line size to correspond to more than one page's worth of cells saves the X-decoder (row control circuit 3) space since different pages worth of data can share the decoders. During a user data read and programming operation, N=4,256 cells (M) are simultaneously selected in this example. The cells (M) selected have the same word line (WL), for example WL2, and the same kind of bit line (BL). Therefore, 532 bytes of data can be read or programmed simultaneously. This 532B data simultaneously read or programmed forms a "page" logically. Therefore, one block can store at least eight pages. When each memory cell (M) stores two bits of data, namely a multi-level cell, one block stores 16 pages in the case of two bit per cell storage. In this embodiment, the storage element of each of the memory cells, in this case the floating gate of each of the memory cells, stores two bits of user data.

FIG. 3 shows a cross sectional view of a NAND cell unit of the type shown schematically in FIG. 2, in the direction of the bit line (BL). At a surface of a p-type semiconductor substrate 9, a p-type region c-p-well 11 is formed, each of the left and right c-p-wells being enclosed by an n-type region 10 to electrically isolate the c-p-wells from the p-type substrate. The n-type region 10 is connected to a c-p-well line made of a first metal M0 via a first contact hole (CB) and an n-type diffusion layer 12. The p-type region c-p-well 11 is also connected to the c-p-well line via the first contact hole (CB) and a p-type diffusion layer 13. The c-p-well line is connected to the c-p-well control circuit 5 (FIG. 1).

The exemplary embodiment uses Flash EEPROM storage units, where each memory cell has a floating gate (FG) that stores an amount of electric charge corresponding to the data being stored in the cell, the word line (WL) forming the gate electrode, and drain and source electrodes made of the p-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring of the first metal (M0) and a second contact hole (V1). The bit line is connected to the column control circuit (2).

FIGS. 4 and 5 show cross sectional views of a memory cell (section 4-4 of FIG. 3) and a select transistor (section 5-5 of FIG. 3), respectively, in the direction of the word line (WL2). Each column is isolated from the neighbor columns by a trench formed in the substrate and filled with isolation material, known as a shallow trench isolation (STI). The floating gates (FG) are isolated from each other by the STI and insulator film 15 and word line (WL). Since the gate electrode (SG) of the select transistor (S) is formed in the same formation process steps as the floating gate (FG) and word line (WL), it shows a stacked gate structure. These two select gate lines (SG) are shunted at the end of lines.

U.S. Pat. No. 6,522,580, that is incorporated by reference above describes the various voltages applied to operate the memory cell array 1, in a specific example, each memory cell's floating gate storing two bits, having one of the states "11", "10", "01", "00". This is reviewed briefly here for the case where the word line "WL2" and the bit lines of "BLe" are selected for erase, reading or programming. By raising the c-p-well to an erase voltage of $V_{erase}$=15-20V and grounding the word lines (WL) of a selected block, the data of the selected block is erased. Since all of the word lines (WL) of the unselected blocks, bit lines (BL), select lines (SG) and c-source are put in a floating state, these are also raised to almost $V_{erase}$ due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible programmed states, namely "11".

The high voltage values used in the erase and programming values can be generated from the lower supply values using a charge pump (not shown in FIG. 1). These higher voltage values can either be produced on the memory chip 22 itself, or supplied form another chip in the memory system. The use and location of the high voltage source is discussed more fully in U.S. Pat. No. 6,282,130, which is hereby incorporated by reference, and additional references cited therein.

FIG. 6 schematically illustrates such a prior art arrangement. Three representative word lines, $WL_A$, $WL_B$, and $WL_C$ are connected to a line 107 that supplies the various voltage levels through transistors 101, 103, and 105, respectively. The transistors 101, 103, and 105 together with line 107 would be part of the row control circuit 3 of FIG. 1. The c-p-well control circuit 5 of FIG. 1 provides the voltage for the well structure c-p-well 11. The word lines then continue on over the well structure 11 to any of the various word lines of the different blocks of memory 1 shown in FIG. 2. In a erase process, with word line $WL_C$ corresponding to a selected word line and $WL_A$ and $WL_B$ both non-selected, the voltage in the c-p-well is raised to the erase voltage of, say, 17 volts and line 107 is set to ground. The gate of transistor 105 is set to the high level of $V_{dd}$, taking word line $WL_C$ to ground, while both of transistors 101 and 103 are turned off by setting their gates to ground, leaving $WL_A$ and $WL_B$ to float. This results in the erase conditions described above, where the unselected erase gates are charged by capacitive couplings from the well (as is described, for example, in U.S. Pat. No. 5,546,341 incorporated above) and the selected erase gates are forced to ground. Other aspects of the erase process are described in U.S. patent application Ser. No. 09/956,201, filed Sep. 17, 2001, which is hereby incorporated by reference. In particular, U.S. patent application Ser. No. 09/956,201 describes a process where the non-selected word-lines can be floated, a process that can also be incorporated into alternate embodiments of the various aspects of the present invention.

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to $V_{dd}$ of a power supply, for example 3V, as well as the unselected bit lines BLo. The unselected word lines WL0, WL1 and WL3 are connected to 10V, the first select gate (SGD) is connected to $V_{dd}$, and the second select gate (SGS) is grounded. As a result, a channel potential of the memory cell (M) that is being programmed is set at 0V. The channel potential in the program inhibition is raised to around 6V as a result of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00".

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to $V_{dd}$ of a power supply, for example 3V, as well as the unselected bit lines BLo. The unselected word lines WL0, WL1 and WL3 are connected to 10V, the first select gate (SGD) is connected to $V_{dd}$, and the second select gate (SGS) is grounded. As a result, a channel potential of the memory cell (M) that is being programmed is set at 0V. The channel potential in the program inhibition is raised to around 6V because of the channel potential being pulled up by the capacitive coupling with the word lines (WL). As explained above, a strong electric field is applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00".

In the read and verify operations, the select gates (SOD and SGS) and the unselected word lines (WL0, WL1 and WL3) are raised to a read pass voltage of 4.5V to make these as pass gates. The selected word line (WL2) is connected to a voltage level specified for each read and verify operation in order to determine whether a threshold voltage of the concerned memory cell has reached such level. For example, in a READ 10 operation, the selected word line WL2 is grounded, so that it is detected whether the threshold voltage is higher than 0V. In this read case, it can be said that a read level is 0V. In a VERIFY 01 operation, the selected word line WL2 is connected to 2.4V, so that it is verified that whether the threshold voltage has reached 2.4V. In this verify case, it can be said that a verify level is 2.4V. Again, for all of the described processes, the recited voltage levels are only exemplary values.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, if the threshold voltage is lower than the read or verify level, the potential level of the concerned bit line (BLe) decreases to a low level, for example less than 0.5V, because of the conductive memory cell (M). Further details of the read and verify operations are explained below.

Examples of Erased Sector Detection Mechanisms

A principal aspect of the present invention are technique to instant and accurate detection of erased sectors when the sectors contain a low, (but necessarily not zero) number of zero bits, due to malfunctioning cells or other problems, and the sector can still be used as the number of corrupted bits is under the ECC correction limit. Current, prior art systems are not tolerant to such cases and would consider the sector as previously written and corrupted, with the result that the system may stop functioning. This method allows the storage system to become tolerant to such erased sectors corruption, allowing such sectors to be used for further data storage if the system can correct this error later in the written data by ECC correction means. Additionally, these techniques may be combined with the sort erased sector abort detection mechanisms described in U.S. patent application Ser. No. 10/751,096 filed on Dec. 31, 2003.

More specifically, the invention describes methods for detecting a partially erased sector (the main, user data along with overhead and ECC area), where such a page is not only detected but the level of corruption is quantified so that it is possible to decide whether the page is suitable for further use or not. When the sector data gets transferred to the controller, firmware or an ECC-customised circuit detects and counts zero bits (for BCH), or symbols (for Reed-Solomon) with at least one zero bit, in the sector, or in every codeword if the sector is divided to multiple adjacent or interleaved codewords. Thus, values of the counters then will contain a number of non-erased bits, or symbols, in the sector (or in every codeword of the sector). These values indicate the level of corruption of the erased sector. For example, in the BCH case, the counter will count the number of zero bits. If the number is well below the ECC correctability limit, the page can be used for programming. If the ECC method allows 4-bit correction, then it would be quite safe to use an erased sector with 1 or 2 faulty bits.

The exemplary embodiments are based on properties of Galois fields and ECC algorithms that use them. For example, BCH and Reed-Solomon methods will generate a zero ECC algorithm for zero data, as an all zero codeword is a valid codeword. Similar strategy can be used for other, more complex, error correction methods. The following discussion will also often refer the unit of the data sector, as this is the common unit for which the ECC codewords are computed. More, generally, though, the described techniques may be readily implemented for other data units FIG. 7 shows a first exemplary embodiment of the present invention that uses the ECC algorithm to help detect erased pages (all FFs). If the sector does not contain all FFs, and the data is not correctable by the error correction algorithm, then the technique makes another attempt to correct the sector data assuming that is was an erased (all FFs) sector but that some bits are faulty (0s). The sector data is first inverted to make the "erased" sector data a valid codeword. An inverted, erased sector (including the ECC field) will have all 0s, which is a valid codeword as zero data generates zero ECC. Consequently, if some (within the ECC limit) bits are high they can be corrected by the same error correction routine as the system normally used.

A first phase 710 is an initial data error detection and correction operation, including an initial check on whether the sector is erased. This is followed by a second phase 750 where the erased sector detection method is performed. The initial phase 710 is optional and may be skipped as an erased page can be detected without it; however it is preferable to include this initial phase as it provides an initial check on whether the page is erased (without corruption) or contains valid data.

The process starts at 701 and an initial check is performed at step 711 to see if the page is erased (all FFs) without any corruption. If so, the process can go directly to step 763 and is finished; if not, the process continues to step 713 to check whether it contains correct, no-erased data. Alternately, the check of step 711 can be placed after step 719 before moving into phase 750.

Step 713 determines whether page contains valid not erased data (715). If not, the process continues and a data correction operation is performed (717). If this results in corrected data, the process ends (721) as corrected data has been extracted using the ECC. If the data cannot be corrected, the error correction phase begins where it is assumed that the section is erased and mainly contains FFs.

The process moves on to phase 750 to determine if the page contains erased but corrupted data. This begins at step 751 by inverting all of the sectors data, including the ECC field. An inverted erased page is a valid codeword for a given ECC algorithm. Step 753 generates a new error correction syndromes as if it were generated by the ECC block. To take one very specific example of 4 codewords per sector with 1 byte syndromes, a first byte can be generated using data bytes 0-128 and 129, a second byte using data bytes 0-128 and 130, and a third byte using data bytes 0-128 and 131 for every four sub-codewords. The more general case of numbers and sizes of codewords follows readily. Using this new syndrome, a correction operation is performed on the inverted data using the new syndrome. If the process is unsuccessful (757 to 759), it is determined that the sector has an uncorrectable amount of error. If the data is corrected (757 to 761), it is checked in step 761 to see if it consists entirely of 0s. If not (761 to 759), there is again uncorrectable error and the initial assumption going into phase 750 was likely wrong. The sector's error is likely too serious to correct and the error has not been properly corrected. If the sector does contain all 0s in step 761, an erased sector, but with an amount of corruption that can be handled, has been found (763).

The various steps in FIG. 7, as well as the embodiments discussed with respect to the following Figures, can be implemented in hardware or firmware/software. Some steps are more easily implemented in one form than another. For example, step 711 (checking the data to see whether it is all FFs) can fairly simply be checked in hardware by checking incoming data on the memory bus. Step 761 (checking for all 0s in the data buffer) will be performed relatively infrequently and can be performed in firmware.

If step 711 hardware can count the number of zero bits in the data, then step 761 may be skipped as the system only needs to know the initial number of zero bits and the number of one bits toggled by error correction; if these are equal, the page will have all zeros. This is readily implemented for BCH based code, which toggles bits during correction. In Reed-Solomon, which corrects symbols, the count would be of non-FF symbols. In either case, this is preferably done for each codeword. (As discussed below, this is much the same as is done in step 771 of FIG. 9.)

The embodiment of FIG. 7 uses an ECC check method without quantification of the level of erased page corruption. In this case, the number of allowed zero bits (Z) in an erased page is fixed based on the ECC method being used. For example, if BCH is used, the maximum number Z of erased bits for an erased page to be correctable to an all FF state (if the faults are evenly distributed) would be $Z$=(maximum number of correctable bits per codeword)×(number of codewords per sector (or other data unit)).

For Reed-Solomon, the corresponding formula is $Z$=(number of correctable symbols per codeword)×(bits per symbol)×(codewords per sector (or other data unit)).

In a practical implementation, a criterion for acceptance can be to not have more tan some allowed number Z of non-erased bits (in BCH) or symbols (Reed-Solomon) in each codeword, where Z, in this embodiment, is equal to the number of correctable bits or symbols. The embodiments shown in FIGS. 8 and 9 allow for a quantification of the level of erased page corruption.

The embodiment shown in FIG. 8 includes an ECC check based on the methods described above, but includes a quantification of the level of erased page corruption. The number of allowed zero bits (Z) in the erased page is identified by the ECC algorithm. For example, BCH gives the number of bit errors it can correct; Reed-Solomon gives number of correctable multi-bit symbols, in which case the level of corruption can be detected as acceptable on the basis of number of corrupted symbols. If the sector consists of more than one codeword, then, the goodness of the sector may be defined by the worst, most corrupted, codeword.

The new elements of FIG. 8, with respect to the embodiment of FIG. 7, are found in sub-phase 770 of the error detection routine 750, which this embodiment places directly after step 753 of generating the new syndrome for the inverted data. The other steps of FIG. 8 (including the option to skip phase 710 and positioning of step 711) can be taken as basically the same as described above with respect to FIG. 7. In the case that an erase page pattern corresponds to all 0s, however, the inversion of step 751 is not need before the following quantification of the level of corruption. (More generally, if an erased page produces a valid codeword only when inverted, an inversion step should be included.

Step 771 quantifies the level of corruption, as described above. In this embodiment, step 757 is used to determine whether the corrected page is erased or not, as step 771 quantifies the amount of error relative to the nearest valid codeword, which may be all-zero but may also be any other codeword.

Step 773 determines if the level is within acceptable limits; if not, the error is taken as uncorrectably high and the routine goes directly to 759 without trying to correct the data. If the level is determined acceptable, the process can go on to step 755 and continue similarly to that of FIG. 7, except the end result, if erased sector is found, in step 763 includes the level of corruption. Note that if 763 is reached directly from step 711 in this embodiment, the level of corruption will be none.

In a variation of FIG. 8, step 771 can be made part of step 755. In this way, the quantification of corruption is complete when the correction is complete, so that the combined result us then the number of bits or symbols corrected. If steps 771 and 755 are combined, step 773 will be placed after the combined step 771/755.

FIG. 9 is a second exemplary embodiment including a quantification of the level of erased page corruption. The routine of FIG. 9 again begins with the initial, optional phase 710, which is as described above for the other embodiments, before proceeding to phase 750, which differs. FIG. 9 again includes quantification of the level of erased page corruption, similar to that shown in FIG. 8, but can be performed without an ECC check based method. Instead, the number of allowed zero bits (Z) in the erased page is identified, for example, by counting zero bits (BCH) or non-all-zero symbols (Reed Solomon).

The process of FIG. 9 again begins with the optional phase 710, as in the earlier described embodiments. Also as before, step 711 may be placed at the beginning or end of phase 710. If step 711 is performed by hardware that can count the number of zero bits in the data, then step later 761 may be skipped as the system only needs to know the initial number of zero bits and the number of one bits toggled by error correction; if these are equal, the page will have all zeros. This is readily implemented for BCH based code, which toggles bits during correction. In Reed-Solomon, which corrects symbols, the count would be of non-FF symbols. In either case, this is preferably done for each codeword.

In the embodiment of FIG. 9, the ECC algorithm itself is not used, but only knowledge about the ECC algorithm characteristics. The counting can again be done by hardware (in either the controller or the memory) or by firmware. Consequently, the level of corruption is quantified in step 771 of FIG. 9 without the need of steps 751 and 753 of FIG. 8. Once the level of corruption is quantified in step 771, its acceptability is determined as before in step 773. If the level exceeds the acceptability limit, the data is taken to have an uncorrectable amount of error (759).

As step 771 has already determined the number of bits or symbols that are incorrect relative to erased sector pattern, if this amount of error is determined acceptable in step 773, it can be directly corrected to all 0s. Consequently, steps 755 and 757 of FIG. 8 are redundant and removed form the flow, while step 761 is now the step of setting the data to the corrected value. Unlike in FIG. 8, step 757 is not needed to determine whether the corrected page is erased or not.

The preceding discussion has been based on detecting an erased sector, where being erased corresponds to a pattern of all FFs, and the ECC is based on Reed-Solomon or BCH algorithms. As mentioned above, these methods can be extended to other ECC algorithms, as will be apparent to those skilled in the art. Additionally, it should similarly be apparent that these techniques can be applied to detect other patterns of data, for example an erased page that consists of all 0s, which may occur in other memory types.

Concerning other memory types, as also noted above, the present invention is applicable not just to the NAND type of flash memory of the exemplary embodiment, but to other architectures and memory technology, such as those describe in U.S. patent application Ser. No. 10/841,379, filed May 7, 2004, and which is hereby incorporated by reference. For example, other EEPROM or charge storing cells could benefit, e.g. a NOR type flash memory with well erase. It can similarly be extended to where the storage element is not a floating gate transistor, for example the dielectric storage element of the kind described in the U.S. patent application entitled "Multi-State Non-Volatile Integrated Circuit Memory Systems That Employ Dielectric Storage Elements", by Eliyahou Harari, George Samachisa, Jack H. Yuan, and Daniel C. Guterman, filed Oct. 25, 2002, which is hereby incorporated by this reference. And although the discussion so far has focused on embodiments using a charge storing device, such as floating gate EEPROM or FLASH cells, for the memory device, it can be applied to other embodiments, for example NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used.

Although the various aspects of the present invention have been described with respect to specific embodiments, it will be understood that the invention is protected within the full scope of the appended claims.

It is claimed:

1. A method determining whether a unit of data of a memory circuit of a memory system has been erased, comprising:

reading at least a portion of the unit of data, the portion including associated error correction code for the unit of data, from an array of non-volatile memo cells of the memory circuit using associated read circuitry of the array; and using logic circuitry of the memory system, subsequently performing a process including:

based upon the associated error correction code as read from the array and without generating a new error correction code check syndrome based on the unit of data, quantifying the level of corruption of the content of the unit of data and, based upon the associated error correction code, determining whether the level of corruption is acceptable;

in response to determining that he level of corruption is acceptable, correcting the data content; and based on the corrected data content, determining whether the data content of the unit of data was erased.

2. The method of claim 1, further comprising:

prior to quantifying the level of corruption of the content of the unit of data, performing an initial determination of whether the data content corresponds to an erased state.

3. The method of claim 2, wherein the initial determination is performed in hardware by checking incoming data on a memory bus.

4. The method of claim 1, further comprising:

prior to quantifying the level of corruption of the content of the unit of data, determining whether the data unit contains valid, non-erased data.

5. The method of claim 4, wherein said determining whether the data unit contains valid, non-erased data includes:
   performing a data correction operation on the content of the data unit.

6. The method of claim 1, wherein said unit of data is a sector of data.

7. The method of claim 1, wherein the error correction code uses a Reed-Solomon algorithm.

8. The method of claim 1, wherein the error correction code uses a BCH algorithm.

9. The method of claim 1, wherein said method is executed by firmware.

10. The method of claim 1, wherein quantifying the level of corruption of the content of the unit of data includes detecting and counting bits that have not been erased.

11. The method of claim 1, wherein quantifying the level of corruption of the content of the unit of data includes detecting and counting symbols containing at least one bit that has not been erased.

12. A method of determining whether a unit of data of a memory circuit of a memory system has been erased, comprising:
   reading at least a portion of the unit of data, the portion including associated error correction code for the unit of data, from an array of non-volatile memory cells of the memory circuit using associated read circuitry of the array; and
   using logic circuitry of the memory system, subsequently performing a process including:
      based upon the associated error correction code as read from the array and without generating a new error correction code check syndrome based on the unit of data, determining and quantifying the level of corruption of the content of the unit of data relative to an erased state; and
      based upon the associated error correction code, determining whether the level of corruption is acceptable.

13. The method of claim 12, further comprising:
   in response to determining that the level of corruption is acceptable, correcting the data content.

14. The method of claim 12, further comprising:
   prior to determining and quantifying the level of corruption, performing an initial determination of whether the data content corresponds to an erased state.

15. The method of claim 14, wherein the initial determination is performed in hardware by checking incoming data on a memory bus.

16. The method of claim 12, further comprising:
   prior to determining and quantifying the level of corruption, determining whether the data unit contains valid, non-erased data.

17. The method of claim 16, wherein said determining whether the data unit contains valid, non-erased data includes:
   performing a data correction operation on the content of the data unit.

18. The method of claim 12, wherein said unit of data is a sector of data.

19. The method of claim 12, wherein the error correction code uses a Reed-Solomon algorithm.

20. The method of claim 12, wherein the error correction code uses a BCH algorithm.

21. The method of claim 12, wherein said method is executed by firmware.

22. The method of claim 12, wherein determining and quantifying the level of corruption of the content of the unit of data includes detecting and counting bits that have not been erased.

23. The method of claim 12, wherein determining and quantifying the level of corruption of the content of the unit of data includes detecting and counting symbols containing at least one bit that has not been erased.

* * * * *

UNITED STATES PATENT AND TRADEMARK OFFICE
CERTIFICATE OF CORRECTION

PATENT NO. : 8,327,238 B2
APPLICATION NO. : 12/208054
DATED : December 4, 2012
INVENTOR(S) : Gorobets Page 1 of 1

It is certified that error appears in the above-identified patent and that said Letters Patent is hereby corrected as shown below:

In the Claims:

Column 12, line 40, please delete "memo" and insert --memory--.

Signed and Sealed this
First Day of October, 2013

Teresa Stanek Rea
*Deputy Director of the United States Patent and Trademark Office*